United States Patent [19]

Donovan

[11] Patent Number: 4,672,246

[45] Date of Patent: Jun. 9, 1987

[54] LOW OFFSET MOSFET TRANSISTOR SWITCH CONTROL

[75] Inventor: William J. Donovan, Yucaipa, Calif.

[73] Assignee: Honeywell Inc., Minneapolis, Minn.

[21] Appl. No.: 838,061

[22] Filed: Mar. 10, 1986

[51] Int. Cl.[4] .......................................... H03K 17/687
[52] U.S. Cl. .................................... 307/571; 307/572; 307/577; 307/490
[58] Field of Search ............... 307/571, 572, 577, 584, 307/490

[56] References Cited

U.S. PATENT DOCUMENTS

| | | | |
|---|---|---|---|
| 3,215,859 | 11/1965 | Sorchych | 307/577 |
| 3,532,899 | 10/1970 | Huth et al. | 307/572 |
| 3,942,039 | 3/1976 | Kikuchi et al. | 307/572 |
| 4,139,878 | 2/1979 | Shuey | 361/93 |
| 4,303,831 | 12/1981 | El Hamamsy | 307/311 |
| 4,307,298 | 12/1981 | El Hamamsy et al. | 307/311 |
| 4,323,796 | 4/1982 | Lathrope | 307/572 |
| 4,415,894 | 11/1983 | Dressler et al. | 307/570 |
| 4,423,330 | 12/1983 | El Hamamsy | 307/311 |
| 4,438,356 | 3/1984 | Fleischer | 307/571 |
| 4,564,770 | 1/1986 | Sherman et al. | 307/311 |

Primary Examiner—Stanley D. Miller
Assistant Examiner—B. P. Davis
Attorney, Agent, or Firm—George A. Leone, Sr.

[57] ABSTRACT

A MOSFET transistor switch control circuit using high impedance, low offset, ground referenced control is disclosed. The invention comprises a first enhancement mode MOSFET having a drain connected to an electrical signal, and a second enhancement mode MOSFET having a gate connected to the gate of the first MOSFET, a source connected to the source of the first MOSFET, and a drain connected to an output of the switch. The invention further comprises, in combination with the above elements, current injection apparatus for injecting current into the switch control circuit, current switching apparatus for connecting and disconnecting the current injection apparatus from and to the switch control circuit, and electrical circuit apparatus for maintaining the gate voltage of the MOSFETs about equal to their source voltage when the current injection apparatus is disconnected, and for increasing the gate voltage when the current injection apparatus is connected.

8 Claims, 3 Drawing Figures

LOW OFFSET MOSFET TRANSISTOR SWITCH CONTROL

FIELD OF THE INVENTION

This invention relates to MOSFET transistor switch controls and, in particular, to MOSFET transistor switch controls using high impedence, low offset, ground referenced control.

BACKGROUND OF THE INVENTION

A common useage for a Metal Oxide Semiconductor Field Effect Transistor (MOSFET) is as a switch. In such applications, MOSFETs function as a switch between two terminals, the drain and the source, when the proper control voltage is applied to the gate terminal. For applications requiring high current and medium voltage commercially available MOSFETs are of the N-channel, enhancement mode type. The enhancement mode MOSFET requires that the gate be more positive than the source by some voltage, usually called the threshold voltage, in order to open the channel between the drain and the source. The threshold voltage for commercially available MOSFETs is typically one to four volts.

Prior art designs of isolated drive circuits cannot effectively switch high frequency ac signals at high speed, high power, and high switching frequencies. One problem encountered in prior art designs using a fixed control voltage is a distortion of the signal being switched due to modulation of the switched signal by the enhancement voltage signal applied to the gate. In prior art devices which employ an oscillator to drive the MOSFET gate, the signal being switched may pass through the oscillator's coupling transformer or capacitors. This pass through effect becomes more likely as the ratio of the oscillation frequency approaches the frequency of the switched signal and may result in serious damage to the circuit.

Another drawback of prior art designs is that such designs do not provide a method for supplying a fixed enhancement voltage without injecting steady state voltage into the signal being switched. The enhancement voltage may be defined as the bias voltage present from the gate terminal to the source terminal which is used to turn the switch on.

Prior art devices are also subject to distortion of the switching signal due to switching transients. These transients are present in MOSFETs due to capacitance in the gate to source junction. During the operation of turning a MOSFET switch on or off, the gate to source junction appears as a capacitor. In steady state operation, it is only necessary to maintain this charge against very small leakage currents. For high-speed switching, a large current must be passed to the gate.

FIG. 1 shows an example of a MOSFET switching circuit using two enhancement mode MOSFETs and an isolated transformer drive. In the circuit shown in FIG. 1, the gate voltage at node 10 is referenced directly to the source voltage at node 20. Such a design causes a current to flow into the source. When the oscillator 50 is enabled, the resultant current will mix with the signal current. When the oscillator is disabled, the current will flow, or divide and flow, into the circuits connected to both sides of the transistor switch depending on the voltage levels present. This type of current flow is caused by the internal diodes 30 and 40 (shown in dotted line) that are a part of the internal structure of all enhancement mode MOSFETs. A circuit such as is shown in FIG. 1 has size and cost disadvantages. In addition, at higher switching frequencies, some of the oscillator frequency will mix with and modulate the switched signal. This type of modulation can also result if the magnitude of the switched signal is very small in comparison to the oscillation signal. As the oscillator frequency approaches the frequency of the switched signal, major distortion of the switched signal can take place.

SUMMARY OF THE INVENTION

Now for the first time a MOSFET transistor switch control circuit using high impedance, low offset, ground referenced control is disclosed. The invention comprises a first enhancement mode MOSFET having a drain connected to an electrical signal, and a second enhancement mode MOSFET having a gate connected to the gate of the first MOSFET, a source connected to the source of the first MOSFET, and a drain connected to an output of the switch control circuit. The invention further comprises in combination with the above elements current injection means for injecting current into the switch control circuit, current switching means for connecting and disconnecting the current injection means to the switch control circuit, and electrical circuit means for maintaining the gate voltage of the first and second MOSFETs equal to their source voltage when the current injection means is disconnected, and increasing the gate voltage when the current injection means is connected.

BRIEF DESCRIPTION OF THE DRAWINGS

For a more complete understanding of the invention, reference is hereby made to the drawings in which.

DESCRIPTION OF THE PREFERRED EMBODIMENT

Figure 2:
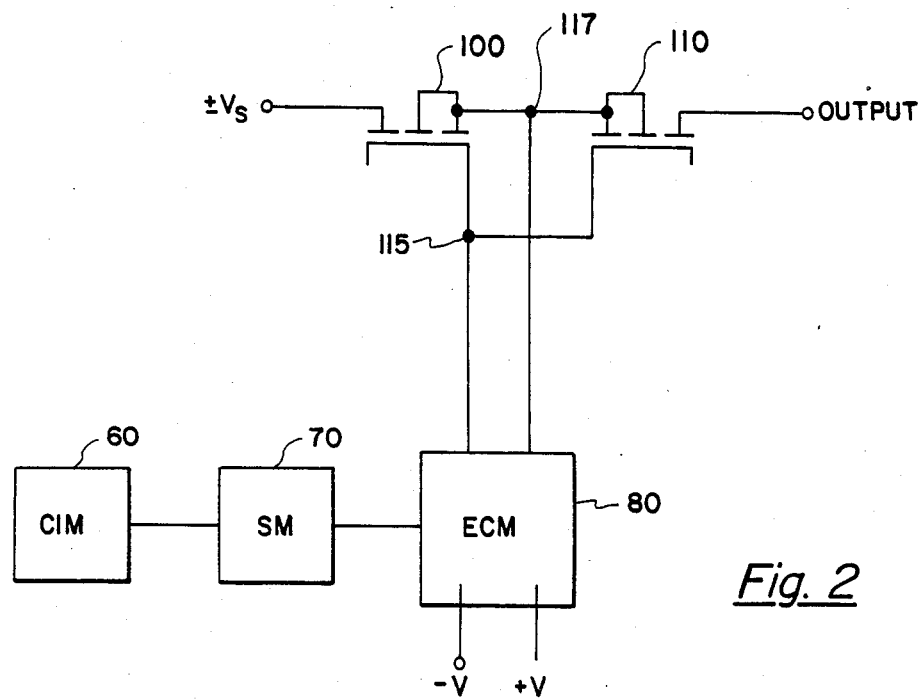
FIG. 2 is a block diagram of a MOSFET transistor switch control.

FIG. 2 is a block diagram of a MOSFET transistor switch control comprising two enhancement mode MOSFETs 100 and 110, an electrical circuit means 80 for controlling the gate voltages of two MOSFETs, current injecting means 60 for injecting current into the electrical circuit 80, and switching means 70 for connecting and disconnecting the current injection means.

The drain of MOSFET 100 is connected to an electrical signal, $V_s$, which is the signal containing the information to be switched. The gate of MOSFET 100 is connected to the gate of MOSFET 110 at node 115. The sources of MOSFETs 100 and 110 are coupled at node 117 to one input of electrical circuit means 80. The gates of MOSFETs 100 and 110 are coupled to a second terminal of electrical circuit means 80. The drain of MOSFET 110 is connected to the switch output. The current injection means 60 is connected via switching means 70 to a second input of electrical circuit means 80.

The operation of the circuit is as follows. The electrical circuit means 80 maintains the gate voltage at node 115 of the MOSFETs 100 and 110 about equal to their source voltage at node 117 when the current injection means 60 is disconnected. In the aforesaid state, the signal $V_s$ is not switched through the MOSFET switch. When the current injection means 60 is connected to the electrical circuit means 80 by the operation of switching means 70, the gate voltage at node 115 is increased resulting in turning on the MOSFETs and switching through the signal, $V_s$.

Figure 1:
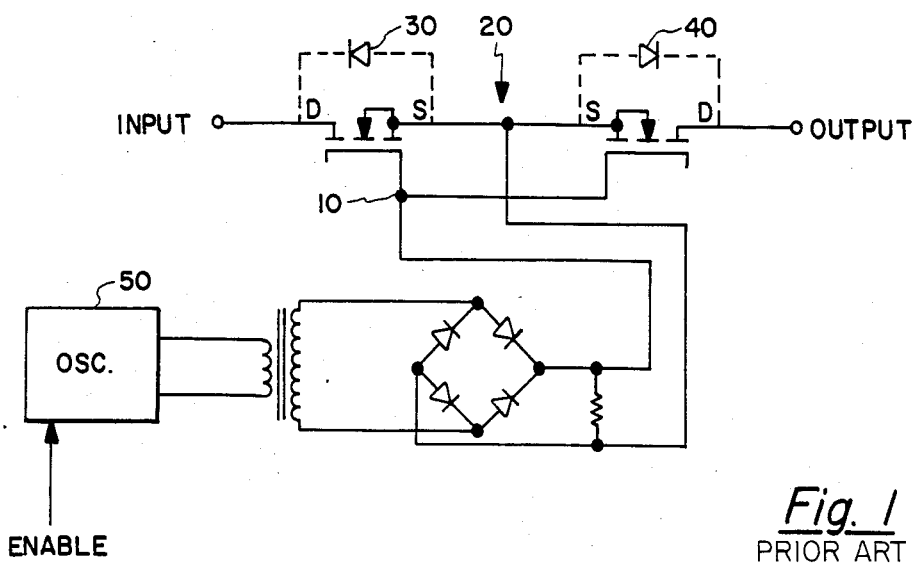
FIG. 1 is a schematic drawing of a prior art isolated transformer drive MOSFET switching circuit.
Figure 3:
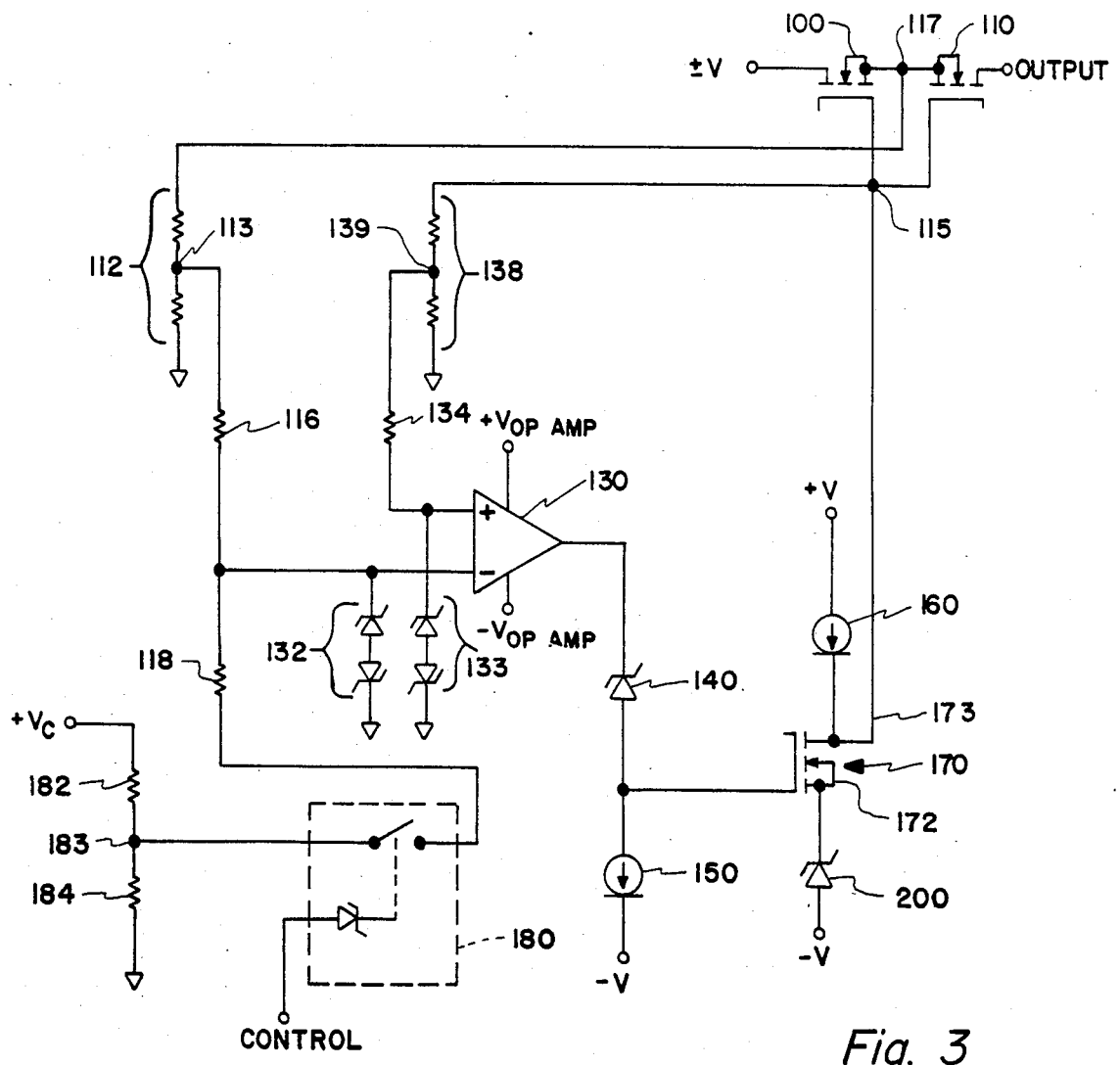
FIG. 3 is a schematic of one example of a MOSFET transistor switch control using high impedance, low offset, ground referenced control.

FIG. 3 shows a detailed example of one embodiment of a MOSFET transistor switch control using high impedance, low offset, ground referenced control. The transistor switch circuit includes three enhancement mode MOSFETs 100, 110, and 170. The gates of MOSFETs 100 and 110 are coupled at node 115 to the source of MOSFET 170 and a first terminal of a first voltage divider circuit 138. The sources of MOSFETs 100 and 110 are coupled together at node 117 and are further connected to a first terminal of a second voltage divider network 112.

Still referring to FIG. 3. MOSFET 170 is used to set the gate voltage at node 115 of the MOSFETs 100 and 110. The source 172 of MOSFET 170 is connected to the cathode of a first zener diode 200. The anode of zener diode 200 is connected to the negative terminal of an external dc voltage supply. Thus, the source 172 is fixed at a point more positive than the negative terminal of the external dc supply. The drain 173 of MOSFET 170 is connected to the cathode of a first constant current diode 160. The anode of constant current diode 160 is connected to the positive terminal of the external dc voltage source.

It can be appreciated that the drain 173 can vary in voltage from the amount of voltage present at the negative terminal of the external dc voltage supply to a positive voltage equal to the bias voltage less the drop of the constant current diode 160. Typically a minimum drop across the constant current diode 160 will be from about 1 volt to about 2 volts. The variation in the drain voltage at drain 173 is proportional to the gate voltage which turns on the transistor 170. With a gate voltage that is less than the threshold voltage of the MOSFET 170, typically about 0.3 to about 0.4 volts, more positive than the source 172, the MOSFET 170 will be off and its drain 173 will be approximately equal to the voltage present at the positive terminal of the external dc voltage source. As the gate to source voltage of the MOSFET 170 exceeds its threshold voltage, the drain voltage will become less positive. In one example of a circuit as shown in FIG. 3, the signal voltage $V_s$ being switched varies between +40 volts and −40 volts, the negative terminal of the external dc voltage supply is about −45 volts and the positive terminal is about +45 volts. The zener diode 200 in an application based on the aforementioned example may advantageously have an avalance voltage of about 2 volts and the constant current diode may be advantageously selected to pass one milliamp of current.

Still referring to FIG. 3, the circuit further comprises an operational amplifier 130 having a noninverting input connected through resistance means 134 to node 139 of voltage divider 138. Operational amplifier 130 also has an inverting input connected through resistance means 116 to node 113 of voltage divider 112. The output of operational amplifier 130 is connected to the cathode of zener diode 140. The anode of zener diode 140 is connected to the gate of MOSFET 170 and is further coupled to the anode of constant current diode 150. The cathode of constant current diode 150 is connected to the negative terminals of the external dc power supply. It can be appreciated that in some applciations the connections between the operational amplifier inputs and the MOSFETs may be made directly, eliminating the need for any resistance means. It can be further appreciated that at lower switching voltages the voltage divider networks 112 and 138 may not be necessary since they are used to scale voltages down to the operating parameters of the operational amplifier selected. It can also be appreciated that one can use a high voltage operational amplifier which would also eliminate the need for any type of voltage divider or scaling network between the source and gate voltages and the inputs of the operational amplifier.

Pairs of zener protection diodes 132 and 133 may advantageously be used to protect the operational amplifier during failure conditions. The protection diodes are not necessary for normal operation of the switching circuit.

For an example of the invention where the switched voltage, $V_s$, ranges from about +40 volts to about −40 volts, both voltage dividers 112 and 138 may advantageously scale down the gate and source voltages by a factor of about four. In such a circuit, the magnitude of the voltage at the positive and negative terminals of the external dc power supply may typically be about 45 volts. Further, with an operational amplifier supply voltage of ±15 volts, the pairs of zener protection diodes 132 and 133 may advantageously have avalance voltages of about 14 volts. In such an example it can be calculated that the maximum current offset seen by the signal path through the sources of MOSFETs 100 and 110 is about 10 microamps at 40 volts. It is possible to reduce this current value even further by employing higher impedance operational amplifiers.

Still referring to FIG. 3, a second terminal of resistance means 118 is connected to the output of a current switching means 180. In one embodiment of the invention, the current switching means may advantageously be a CMOS type switch or a similar device. The input of the current switching means 180 is coupled at node 183 to the output terminal of the constant voltage source circuit comprising resistance means 182 and 184. One terminal of resistance means 184 is coupled to ground and the other terminal is coupled to the second terminal of resistance means 182 at node 183. The other terminal of resistance means 182 is connected to an external voltage source, $V_c$. $V_c$ is typically the same voltage source as the positive voltage supply to the operational amplifier.

While the examples included herein employ an N-channel type enhancement MOSFET, it can be appreciated that, with appropriate changes of polarity in the circuit connections, P-channel type MOSFETs may be appropriately used in certain embodiments of the invention. Further, while there has been shown and described a preferred embodiment of the invention, those skilled in the art will appreciate that various changes and modifications may be made to the illustrated embodiment without departing from the true spirit and scope of the invention which is to be determined from the appended claims.

The embodiments of the invention in which an exclusive property or right is claimed are defined as follows:

1. A MOFSET transistor switch control circuit using high impedance, low offset, ground referenced control comprising in combination:

a first enhancement mode MOSFET having a drain connected to an electrical signal;

a second enhancement mode MOSFET having a gate connected to the gate of the first MOSFET, a source connected to the source of the first MOSFET, and a drain connected to an output of the switch;

a third enhancement mode MOSFET having a drain coupled to the gates of the first and second MOSFETs;

a first zener diode having an anode connected to a negative terminal of an external dc power source and further having a cathode connected to the source of the third MOSFET;

a first constant current diode having a cathode connected to the drain of the third MOSFET and an anode connected to the positive terminal of an external dc power source;

an operational amplifier having an inverting input connected to the sources of the first and second MOSFETs, and further having a noninverting input connected to the gates of the first and second MOSFETs;

a second zener diode having a cathode connected to the output of the operational amplifier and an anode connected to the gate of the third MOSFET;

a second constant current diode having a cathode connected to a negative terminal of an external dc power source an an anode connected to the gate of the third MOSFET;

a resistance means connected at a first terminal to the inverting input of the operational amplifier;

current switching means for switching additional current into the switch control circuit to turn on the first and second MOSFETs having an output connected to the resistance means; and current source means for providing an injection current to the input of the current switching means.

2. The device of claim 1 wherein:

the first zener diode has an avalance voltage of about two volts;

the first and second constant current diodes each maintain a constant current of about one milliamp;

the source current of the first and second MOSFETs is no more than about ten microamps;

the negative terminal of the external dc voltage source is about a negative forty-five volts and the positive terminal is about a positive forty-five volts;

the electrical signal connected to the drain of the first MOSFET ranges from about a positive forty volts to about a negative forty volts; and the second zener diode has a breakdown voltage of about forty-four volts.

3. The device of claim 2 wherein the current switching means comprises a CMOS switch.

4. The device of claim 3 further including a first pair of protection zener diodes having anodes connected together, the cathode of one of the diodes connected to the inverting input of the operational amplifier and the cathode of the other diode connected to ground; and further including a second pair of protection zener diodes similarly connected between the noninverting input of the operational amplifier and ground.

5. The device of claim 4 wherein the protection zener diodes have breakdown voltages of about fourteen volts.

6. The device of claim 5 wherein the current switching means comprises a CMOS switch.

7. The device of claim 6 additionally comprising:

a first circuit means for scaling the source voltage of the first and second MOSFETs to match the input parameters of the operational amplifier, the first circuit means for scaling being connected between the sources of the first and second MOSFETs and the inverting input of the operational amplifier; and a second circuit means for scaling the gate voltage of the first and second MOSFETs to match the input parameters of the operational amplifier, the second circuit means for scaling being connected between the gates of the first and second MOSFETs and at a second terminal to the noninverting input of the operational amplifier.

8. The device of claim 7 wherein the first and second scaling means each comprise a four to one voltage divider network.

* * * * *